United States Patent
West

(10) Patent No.: US 6,173,428 B1
(45) Date of Patent: Jan. 9, 2001

(54) APPARATUS AND METHOD FOR TESTING USING CLOCKED TEST ACCESS PORT CONTROLLER FOR LEVEL SENSITIVE SCAN DESIGNS

(75) Inventor: Jeffrey D. West, Eau Claire, WI (US)

(73) Assignee: Cray Research, Inc., Eagan, MN (US)

( * ) Notice: Under 35 U.S.C. 154(b), the term of this patent shall be extended for 0 days.

(21) Appl. No.: 08/340,238

(22) Filed: Nov. 16, 1994

(51) Int. Cl.[7] .................................................. G01R 31/28
(52) U.S. Cl. ............................................................ 714/727
(58) Field of Search ................................. 371/22.3, 22.5, 371/22.1; 324/73 R, 158.1, 158 R; 395/575; 307/272.2; 714/727, 726, 729, 731, 733, 736, 742, 25, 30

(56) References Cited

U.S. PATENT DOCUMENTS

| | | | |
|---|---|---|---|
| 4,945,536 | * | 7/1990 | Hancu .................................. 371/22.3 |
| 5,281,864 | * | 1/1994 | Hahn et al. ......................... 307/272.2 |
| 5,355,369 | * | 10/1994 | Alan et al. ........................... 371/22.3 |
| 5,381,420 | * | 1/1995 | Henry .................................. 371/22.3 |
| 5,396,501 | * | 3/1995 | Sengoku .............................. 371/22.3 |

FOREIGN PATENT DOCUMENTS

| | | | |
|---|---|---|---|
| 0 470 802 A2 | * | 8/1991 | (EP) . |
| 0 514 700 A2 | * | 4/1992 | (EP) . |
| 0 590 575 A1 | * | 9/1993 | (EP) . |
| 0 651 261 A2 | * | 9/1994 | (EP) . |

OTHER PUBLICATIONS

IEEE Publication "Scan Bits", Benoit Nadeau–Dostie et al; 1994.*
European Search Report for International Application No. PCT/US 95/07672 completed on Nov. 23, 1995 by Examiner Garcia L. Sarasua; 2 pages.*

The ABCs of Boundary–Scan Test, Fluke and Philips—The Global Alliance in T&M, (1991).*

* cited by examiner

Primary Examiner—Nadeem Iqbal
(74) Attorney, Agent, or Firm—Schwegman, Lundberg, Woessner & Kluth, P.A.

(57) ABSTRACT

A test access port controller for use in a level sensitive scan design having test design logic including at least one serial scan test path. The test access port controller includes test access port controller logic operable in a system test mode for controlling the serial shifting of input test data into the at least one serial scan test path and for controlling serial shifting of resulting output test data out of the at least one serial scan test path after performance of system mode test under control of a test clock. The test access port controller further includes clock logic for providing the test clock to the test access port controller logic and the test design logic in system test mode. The clock logic further provides a system clock to the test access port controller logic and test design logic in a fabrication test mode to serially shift input test data into the test access port controller logic and test design logic and to serially shift resulting output data out of the test access port controller logic and test design logic after operation of the test access port controller logic and test design logic under one cycle of test clock. A test method for such level sensitive scan designs includes serially shifting input test data into the test access port controller and the test design logic under control of the system clock. Then the test access port controller is operated under control of the test clock for at least one cycle to generate resulting output test data. The resulting output test data is serially shifted out of the test access port controller and the test design logic under control of the system clock.

14 Claims, 11 Drawing Sheets

APPARATUS AND METHOD FOR TESTING USING CLOCKED TEST ACCESS PORT CONTROLLER FOR LEVEL SENSITIVE SCAN DESIGNS

FIELD OF THE INVENTION

The present invention relates generally to testing for level sensitive scan designs. In particular, the present invention relates to fabrication testing of test logic for level sensitive scan designs using a clocked test access port controller.

BACKGROUND OF THE INVENTION

Device packaging advances are making it nearly impossible to access device leads on PC boards. For example, new advances have allowed for high primary input/output (I/O) pin count on an application specific integrated circuit (ASIC), but allow for no observability of the connections between the ASIC and board it is used on. Level sensitive scan design, for example, boundary scan, has emerged as a way to solve the increasing difficulty in testing packaged devices. Boundary scan methodology is based on a formally adopted IEEE/ANSI standard, IEEE/ANSI 1149.1-1990. This design-in test technique provides virtual access to devices and allows for simplified pattern generation to detect and diagnose structural board faults.

Most design test techniques utilize some form of serial scan test path. At the ASIC level, design test of device logic 14 on the ASIC 10, as shown in FIG. 1, may be accomplished with the use of level sensitive scan design style flip-flops (not shown). The flip-flops are connected together to form one serial scan chain and there may be several serial scan chains or test paths on an ASIC. When all the flip-flops in the ASIC are scannable, testing of the device logic of the ASIC is simplified. A vector pattern or input test data is scanned into the serial scan chain(s). One system clock is applied and the resulting output test data is scanned out of the serial scan chain(s). Scan testing results in very high fault coverage. This is especially important on large ASICs. Scan testing further allows the use of other third party test pattern generation tools to create test vectors.

At the system level, for example, at a board level including several ASICs as shown in FIG. 1, scanning in and out test data is used to test the device logic 15 of the ASICs 10 and the interconnects therebetween. The number of test pins needed to access the board is minimized. The term 'boundary scan' has come to describe the serial scan path that is associated with testing of the input/output latches on an ASIC 10, FIG. 1, and, therefore, its interconnects as well. Boundary scan provides test access to device pins 12 by associating a serial shift registry element, or scan cell 14, with each signal pin 12. The boundary scan cells 14 are linked together to form a shift register chain around the device boundary. These scan cells 14 can then be used to control and observe the device pins 12. Each ASIC 10 on the board may have its test data out pin (TDO) connected to the test data in pin (TDI) of the next ASIC in the chain. This creates a daisy chain serial connection of all the ASICs 10 on the board and, therefore, when scanning in a test pattern, all of an ASIC's test data is scanned in at one time.

The boundary scan standard, IEEE/ANSI 1149.1-1990, entirely incorporated herein by reference thereto, is a collection of design rules applied principally at the integrated circuit (IC) level. This standard makes it possible to employ software to control the growing cost of designing and producing digital systems. The primary benefit of this standard is its ability to transform extremely difficult printed circuit board testing problems into well-structured problems that software can solve easily and swiftly. Adhering to this standard enables the purchase of both third party hardware testers and software that will automatically generate test patterns to test the ICs.

Boundary scan is similar to the scan methodology described above using level sensitive scan design type flip-flops. The difference is that, as the name infers, the scan circuitry is associated with flip-flops that make up the ASIC's boundary, i.e., primary in and out flip-flops. All of the boundary flip-flops on each ASIC are connected together into a serial scan test path. The test patterns are shifted into each ASIC under control of test access port (TAP) controller 16 clocked by a test clock input (TCK). After the test patterns are shifted into the serial scan test paths, one test clock cycle is applied and the resulting output data is shifted out of the serial scan path under control of the test access port controller. Upon checking the response data, faults can be detected. The TAP controller provides the necessary clock, data, and control function needed to use the serial scan paths for testing. A TAP controller 16 is designed and built into each ASIC.

For ASIC level testing or fabrication testing, the ASIC device logic is tested using level sensitive scan techniques as described above. Such fabrication testing of the device logic does not require the use of the TAP controller 16 as the test is run using the system clock utilized by the computer system of which the ASIC is a part.

In prior systems designed using level sensitive scan design techniques, the test logic including the TAP controller 16 and associated test logic such as the boundary scan cells and other associated registers, is not entirely tested at the fabrication stage. Such fabrication testing of the test logic was cost and time prohibitive and problematic because of a gated clock problem. Level sensitive scan design is a dual latched based technology, wherein the two latches each need their own nonoverlapping clock pulses for proper gating of signals throughout the system. The TAP controller of level sensitive scan designs generates several signals utilized as clock signals for various types of registers in the test logic. Since these clock signals utilized for clocking are generated by the internal test logic, they are considered gated clocks and such clocks could not be utilized for scanning test patterns into the test logic for fabrication testing thereof. Without fabrication testing of the test logic at the ASIC level, when subsequent testing procedures are performed, it is not known whether the test logic or other logic/interconnects are faulted if a fault is detected.

For this reason, and for other reasons stated below, which will become apparent to those skilled in the art upon reading and understanding the present specification, there is a need in the art for enhancements to allow for fabrication testing of the test logic of a level sensitive scan design. By providing the ability to perform fabrication testing of the test logic without making any substantial changes in the way that the ASIC device logic is fabrication tested, fabrication testing could be performed with little time and cost. Such fabrication testing of the test logic would allow the purchaser of such ASICs to be assured that the ASICs are entirely substantially free of defect.

SUMMARY OF THE INVENTION

In accordance with the above Background, a level sensitive scan design test circuit is described for allowing the test circuitry of the level sensitive scan design to be tested at the foundry during wafer tests when the remainder of the ASIC logic is tested. A test access port controller for use in a level sensitive scan design is described with the level sensitive scan design having design logic including at least one serial scan test path. The test access port controller includes test access port controller logic operable in a system test mode for controlling the serial shifting of input test data into the at least one serial scan test path and for controlling serial shifting of resulting output test data out of the at least one serial scan test path after performance of system mode test under control of a test clock. The test access port controller further includes clock logic for providing the test clock to the test access port controller logic in system test mode and for providing a system clock to the test access port controller logic in a fabrication test mode for control of the test access port controller to serially shift input test data into the test access port controller logic and design logic and to serially shift resulting output data out of the test access port controller logic and design logic after operation of the test access port controller logic and design logic under control of at least one cycle of the test clock.

A test method for level sensitive scan designs is also described. The level sensitive scan design includes a test access port controller and design logic having at least one serial scan test path. The test access port controller being clocked by a test clock for controlling testing using the at least one serial scan test path. The test method includes serially shifting input test data into the test access port controller and the design logic under control of a system clock. The test access port controller and design logic is then operated under control of the test clock for at least one cycle to generate resulting output test data and resulting output test data is serially shifted out of the test access port controller and the design logic under control of the system clock.

In one embodiment of the method, one of the system clock and the test clock is provided to the test access port controller as a function of a mode signal.

DETAILED DESCRIPTION OF THE PREFERRED EMBODIMENT

Figure 1:
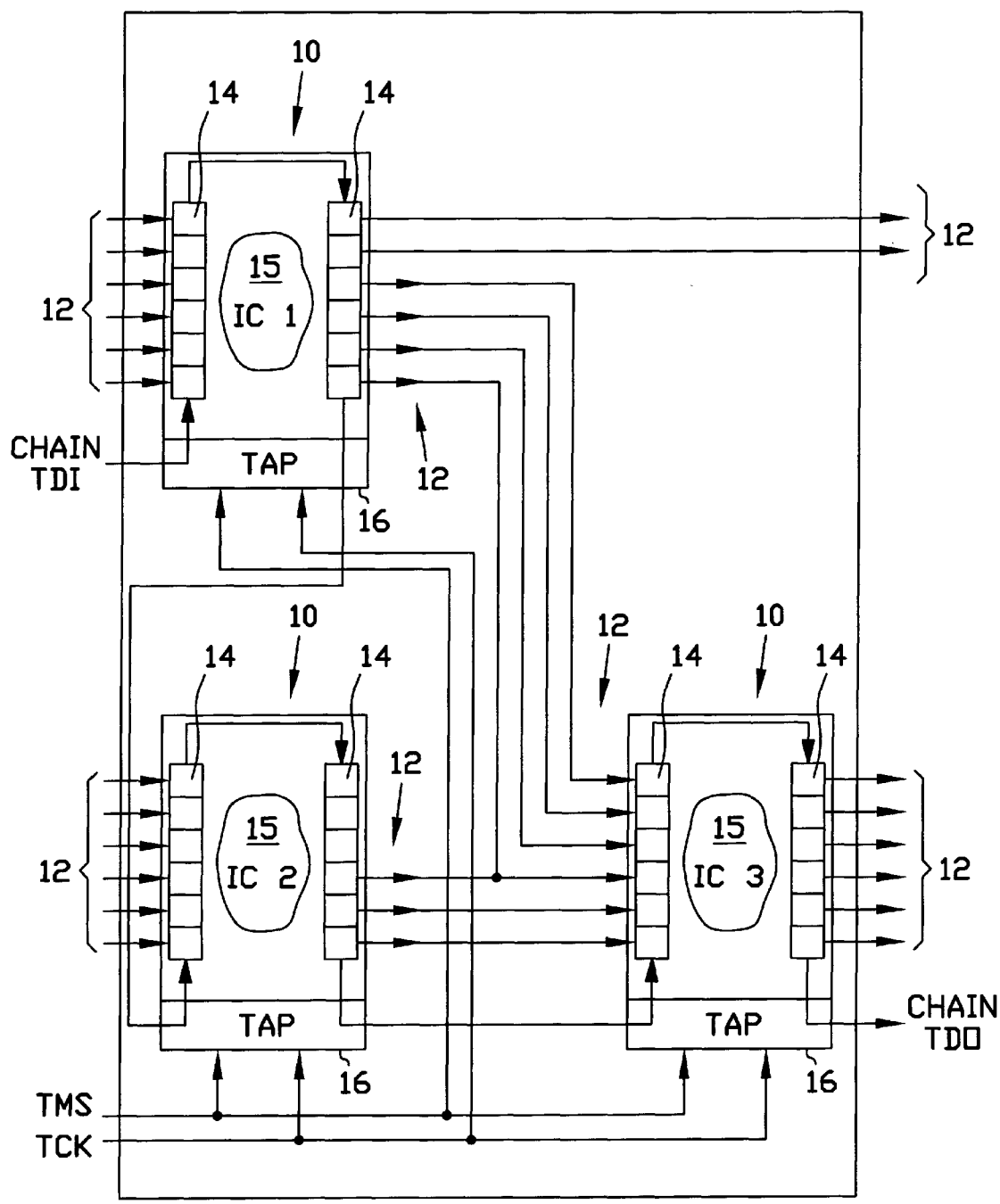
FIG. 1 is a diagram showing boundary scan at a board-level.
Figure 2:
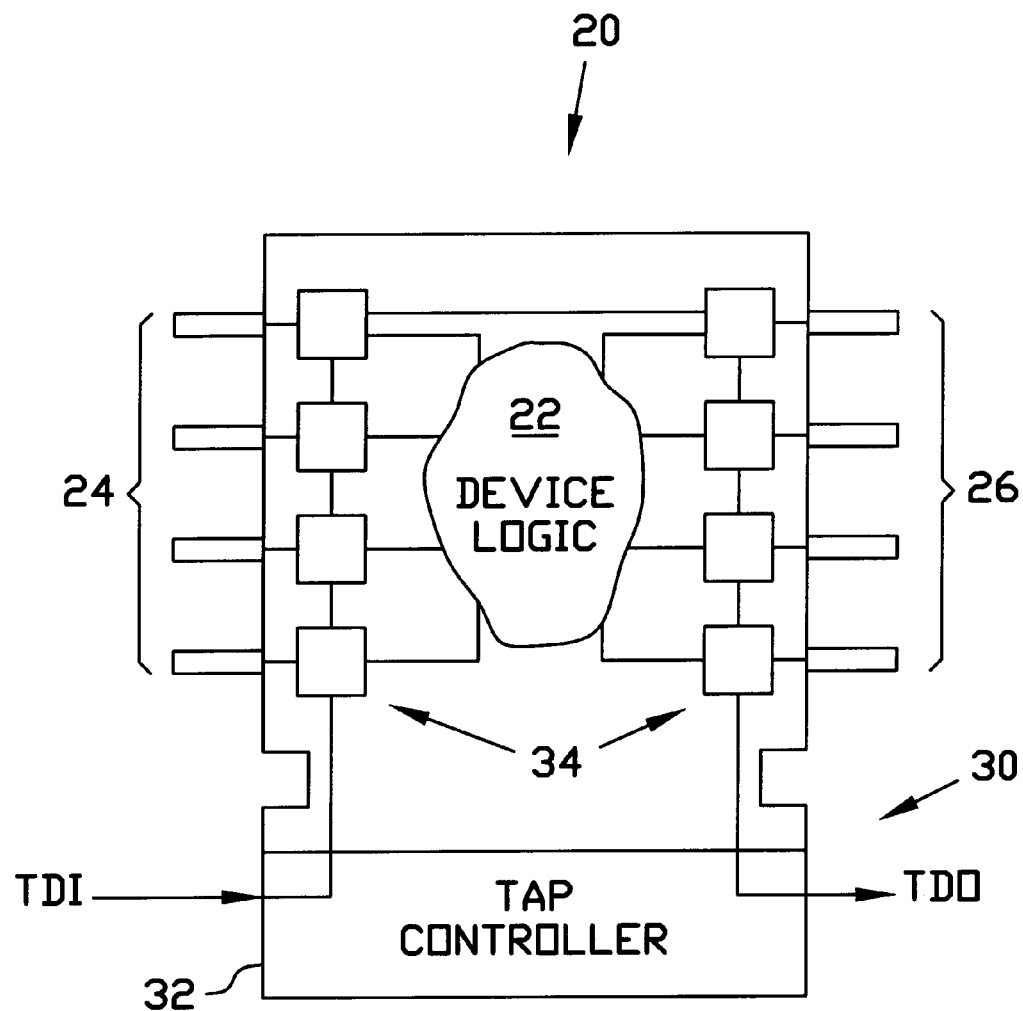
FIG. 2 is a diagram showing boundary scan on an ASIC including boundary scan cells and a TAP controller in accordance with the present invention.

The present invention shall be describe with reference to FIGS. 2–9. FIG. 2 is a diagram depicting an ASIC 20 including device logic 22, test logic 30, input pins 24 and output pins 26. The test logic 30 includes test access port (TAP) controller 32 in accordance with the present invention and other associated test logic.

In the preferred embodiment of the present invention, the test logic 30 is boundary scan test logic, a dual latched technology designed in accordance with boundary scan standard, IEEE/ANSI 1149.1-1990, which includes a collection of level sensitive scan design rules for application principally at the integrated circuit level. This standard is incorporated herein in its entirety by reference thereto. The boundary scan test logic 30 includes the serial scan test path that is associated with system level testing of input and output latches of the device logic 22 of ASIC 20 and, therefore, their interconnects as well to other devices or ASICs connected thereto, such as, for example, described in the Background of the Invention section herein with respect to system level testing.

Figure 4:
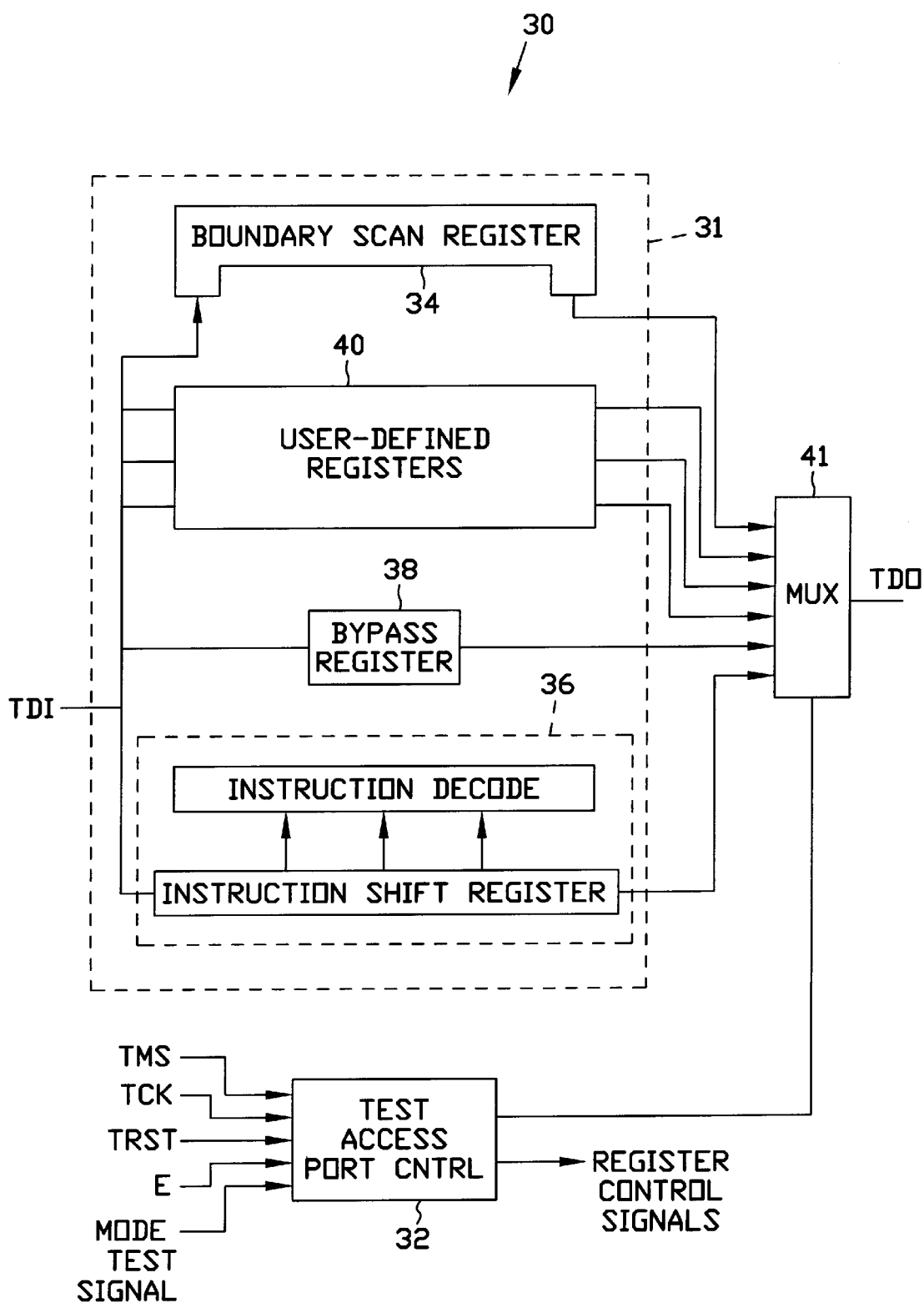
FIG. 4 is a block diagram showing the TAP controller of FIG. 2 and associated test logic for boundary scan.

The boundary scan test logic 30, FIG. 4, includes registers 31, the TAP controller 32, and multiplexer 42. The registers 31 include the boundary scan register 34, user defined registers 40, bypass register 38, and instruction register 36. The boundary scan register 34 controls and observes activities on the ASIC input pins 24 and output pins 26. This register has boundary scan cells adjacent to each ASIC input pin 24 and ASIC output pin 26. The instruction register 36 defines the mode in which the boundary scan test logic operates. The bypass register 38 consists of one boundary scan cell that shortens the scan chain to a single cell. The IEEE/ANSI 1149.1 standard requires an instruction register, bypass register and boundary scan register to be on each ASIC and each register is designed in accordance therewith. The user-defined registers 40 are allowed by IEEE/ANSI 1149.1 for flexibility such that registers unique to a particular ASIC and to the system can be utilized. Examples of user-defined registers 40 may include registers such as an identification register that allows the manufacturer, part number or other information concerning the ASIC to be determined. User-defined registers may also be used in determining system operating conditions or capturing the state of the system when the system is running application code.

The present invention applies to all associated test logic used in the boundary scan and is not limited to those listed herein. This description, however, will be limited to the registers required under the IFEE/ANSI standard for boundary scan design for simplicity purposes. In addition, the present invention shall apply to all level sensitive scan designs that utilize a TAP controller like that described herein for controlling the scanning in and scanning out of test data for testing purposes and shall not be limited to just boundary scan. Other serial scan paths that do not reside at the boundary of devices and which utilize a TAP controller for control thereof are contemplated in accordance with the present invention as described in the accompanying claims. However, for simplicity purposes this description shall be limited to the present invention utilized with boundary scan.

Figure 5:
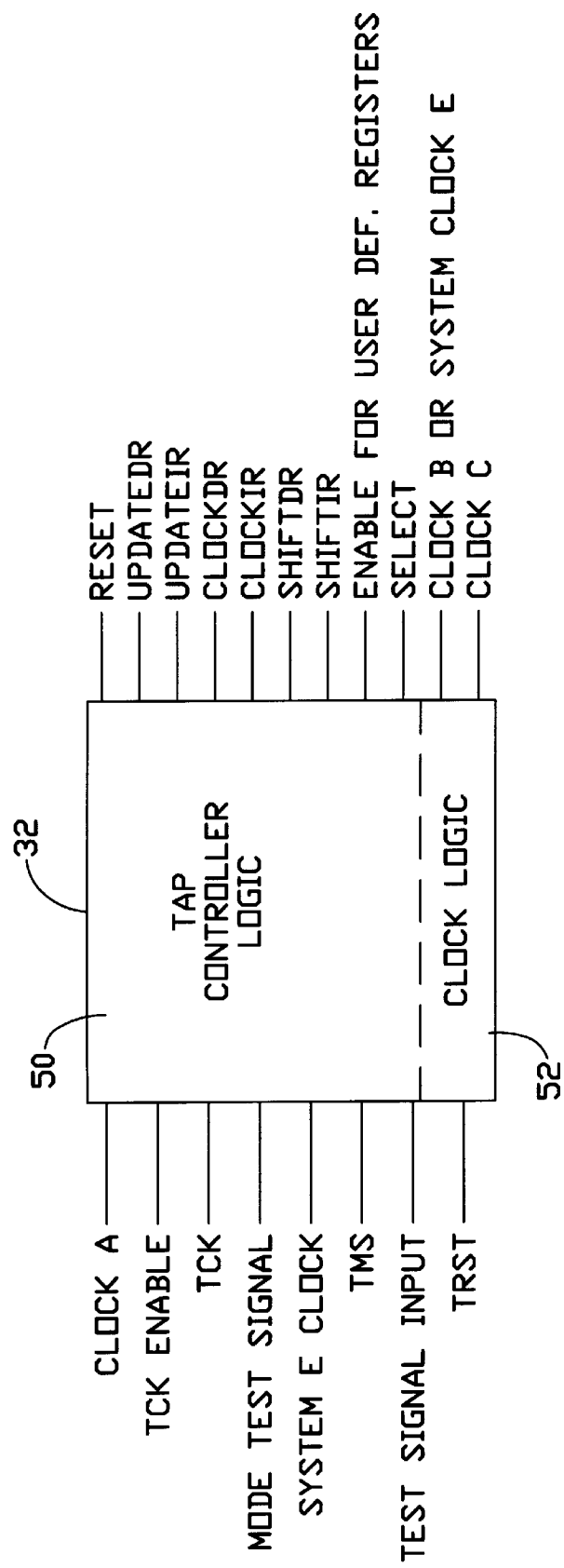
FIG. 5 is a general block diagram of the TAP controller of FIG. 2 showing inputs and outputs in accordance with the present invention.

The TAP controller 32, FIG. 5, includes TAP controller logic 50 and clock logic 52. The TAP controller 32 provides the necessary clock, data, and control functions needed to use the boundary scan test logic 30 for testing at a system level. TAP controller 32 uses the following four typical inputs for boundary scan test: TDI-test data in; TDO-test data out; TCK-test clock; and TMS-test mode select. Input TRST-test reset is also utilized. These inputs are provided in accordance with the IEEE/ANSI standard. In addition to these inputs, the following inputs are also provided to TAP controller 32. They include: Clock A from a tester used to test the ASIC device logic; mode test signal; E-system clock, test signal input and Enable TCK. These inputs are also shown in detailed FIG. 9. TCK is split into two clock pulses by a chopper circuit which generates a clock pulse at the rising edge of TCK (hereinafter referred to as Clock C) and at the falling edge of TCK (hereinafter referred to as Clock B). In typical boundary scan, the TAP controller is clocked by Clock C and Clock B and as described below, with respect to system test mode, the TAP controller 32 and the other associated test logic of test logic 30 is also clocked by Clock C and Clock B.

Generally, the clock logic 52 receives the system clock E, mode test signal, and Clock B generated at the falling edge of TCK. The mode test signal is representative of whether the system is to be clocked in system mode or in fabrication test mode. Depending upon the state of the mode test signal, the output of the clock logic 52 is either the system clock E or Clock B. This clock logic 52 allows test data at the test signal input to be clocked into the tap controller logic and the associated test logic such as the registers under control of Clock A, a tester supplied clock signal, and system clock E for fabrication testing of the test logic 30 during fabrication test mode. After the input test data is serially shifted into the tap controller logic and the associated test logic, the clock logic 52 allows for application of one test cycle under control of Clock B and Clock C in a system test mode. The resulting test data is then serially shifted out of the TAP controller logic and the associated test logic under control once again of Clock A and system Clock E in fabrication test mode. When boundary scan is utilized, as opposed to fabrication testing of the test logic 30, the clock logic 52 allows the TAP controller 32 to operate under control of Clock B and Clock C, which is enabled by the enable clock signal, whenever the TAP controller 32 is operating in system mode in accordance with the IEEE/ANSI standard.

Figure 3:
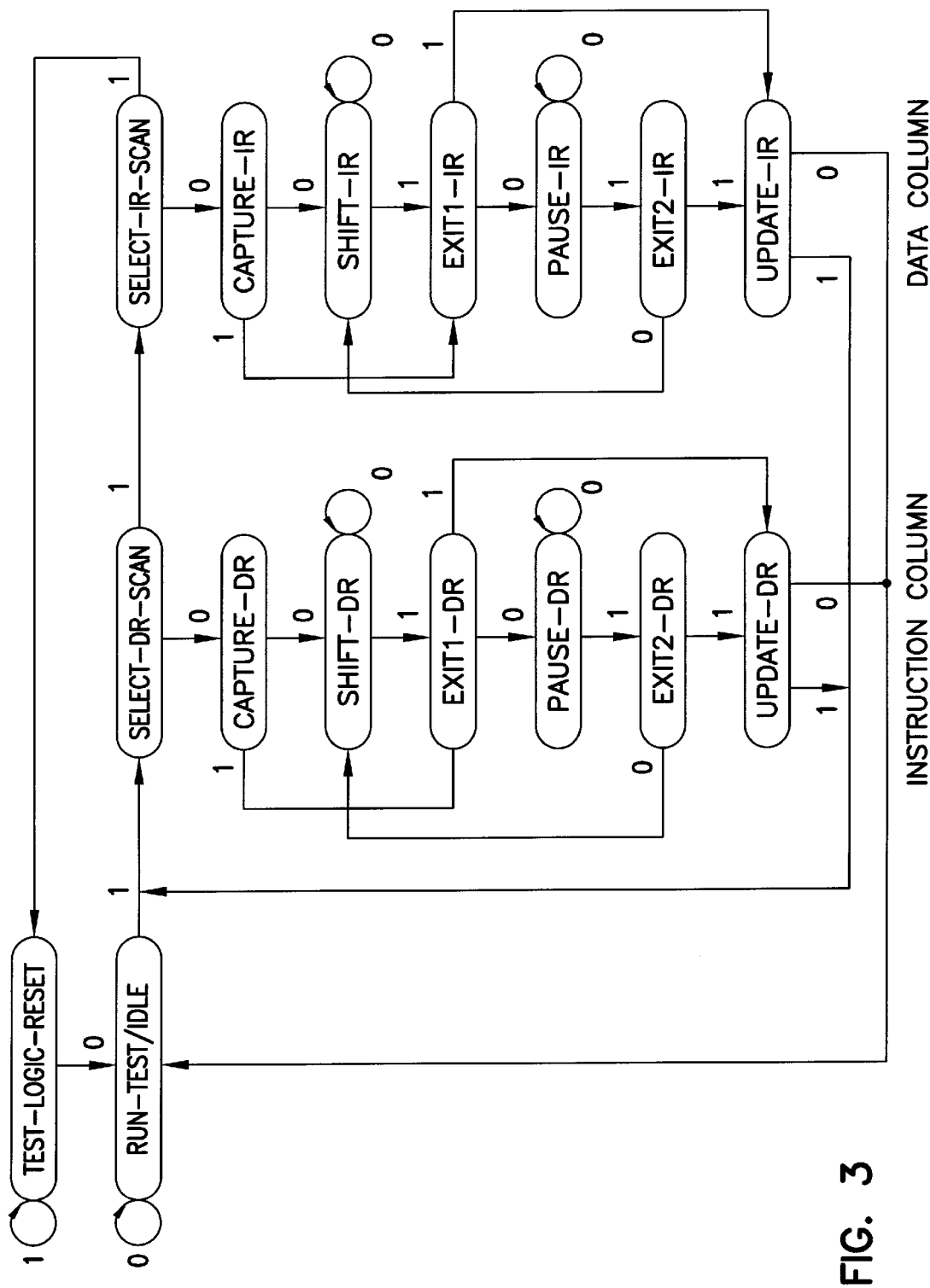
FIG. 3 shows a TAP controller state transition diagram for the TAP controller of FIG. 2.

The TAP controller 32, operating in system mode, is a finite-state machine having a state transition diagram as shown in FIG. 3. The TAP controller 32 controls the several operating modes for testing the device logic 22, testing the external input pin 24 and output pin 26 connections, and for controlling any other operations utilizing the user-defined registers 40 in boundary scan test. The TAP controller 32 has 16 states. A transition between states only occurs on a rising edge of the test clock TCK or Clock C. The logic level of the test mode select (TMS) signal at the rising edge of TCK or Clock C determines which state the TAP controller 32 goes to. As indicated above, the TAP state transition diagram is shown in FIG. 3. Each state contains a label. Each arc between states is labeled with a 0 or 1 that indicates the logic value of FMS that must be set up before Clock C causes the transition. The falling edges of TCK do not cause state transitions, but do cause other actions within the boundary scan test logic. There are two paths through the TAP controller state machine. The first path controls the loading of the instruction register. This path is indicated by the commands that are suffixed with "-IR" The second path contains control states that will serially load a chosen data register with data input at the test data input TDI. These tap controller states are suffixed with "-DR" Each of these paths serve the same purpose, but for different registers. This TAP controller state machine, including utilization of TRST, operates in accordance with the IEEE/ANSI standard for boundary scan and therefore shall not be described in further detail.

As the level sensitive boundary scan test logic 30 is a dual latched based technology, the two latches each need their own nonoverlapping clock pulses for proper gating of signals throughout the test logic. In system mode, one latch of the dual latches in the TAP controller logic 50 is clocked by Clock C and the other by Clock B. The TAP controller logic further generates output clock signals as a function of the clock inputs. Such output clock signals include: ClockIR, ClockDP, UpdateIR, ShiftDR, ShiftIR and UpdateDR. These output clock signals are used to clock one of the latches of the dual latches of the associated test logic such as a boundary scan cell, with the other latch being clocked by Clock B.

In fabrication test mode, the dual latches of the TAP controller logic 50 arc clocked by Clock A and system clock E. Once again, the TAP controller logic 50 generates output clock signals as a function of the clock inputs Clock A and system clock E. Such output clock signals include: ClockIR, ClockDR, UpdateIR, ShiftDR, ShiftIR and UpdateDR These output clock signals are used to clock one of the latches of the dual latches of the associated test logic such as a boundary scan cell, with the other latch being clocked by system clock E.

As described in the Background of the Invention section herein, the device logic 22 of ASIC 20 is tested at fabrication with use of a system clock E and serial scan test paths, but without the control of the TAP controller 32. In accordance with the present invention, the test logic 30 can also be fabrication tested such that the entire ASIC logic is tested at the wafer level. The clock logic 52 with the input therein of the system clock E, Clock B and the mode test signal representative of whether the system is operating in fabrication test mode or system test mode, permits the system to overcome the gated clock problem for testing the test logic and permits the fabrication testing of the test logic 30. As described in further detail below with reference to FIGS. 6–9, the TAP controller logic 50 and associated test logic such as boundary cells are operated under control of system clock E and Clock A in fabrication test mode when scanning test data into the test logic 30. Once the input test data is serially shifted into the test logic, the test logic is operated in a system mode under control of Clock B and Clock C for one cycle resulting in output test data. The resulting output test data is then serially shifted out of the test logic 30 in fabrication test mode under control of Clock A and system clock E.

Figure 8:
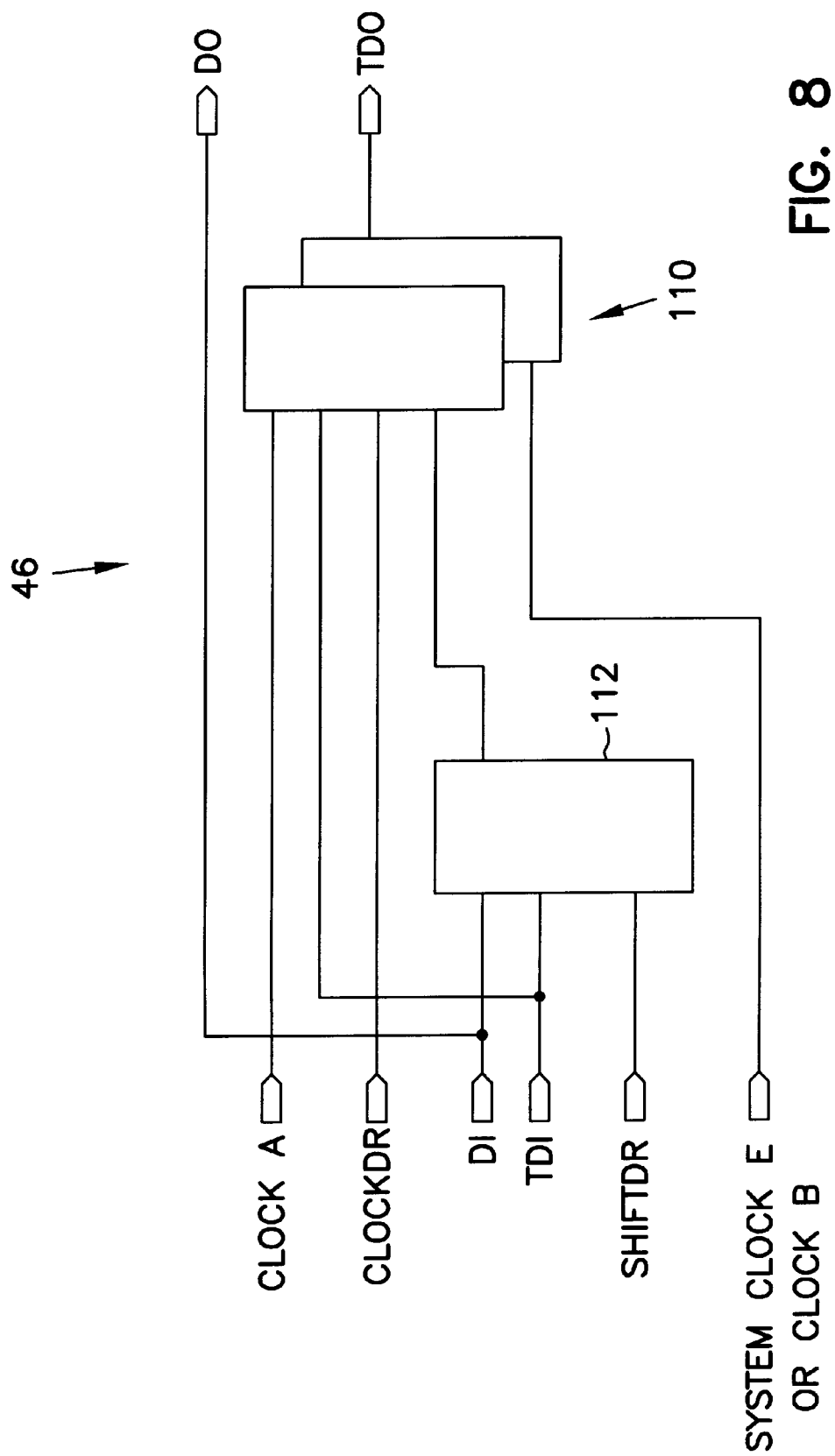
FIG. 8 is a block diagram of an input boundary scan cell of the boundary scan register of the associated test logic of FIG. 4.
Figure 9A:
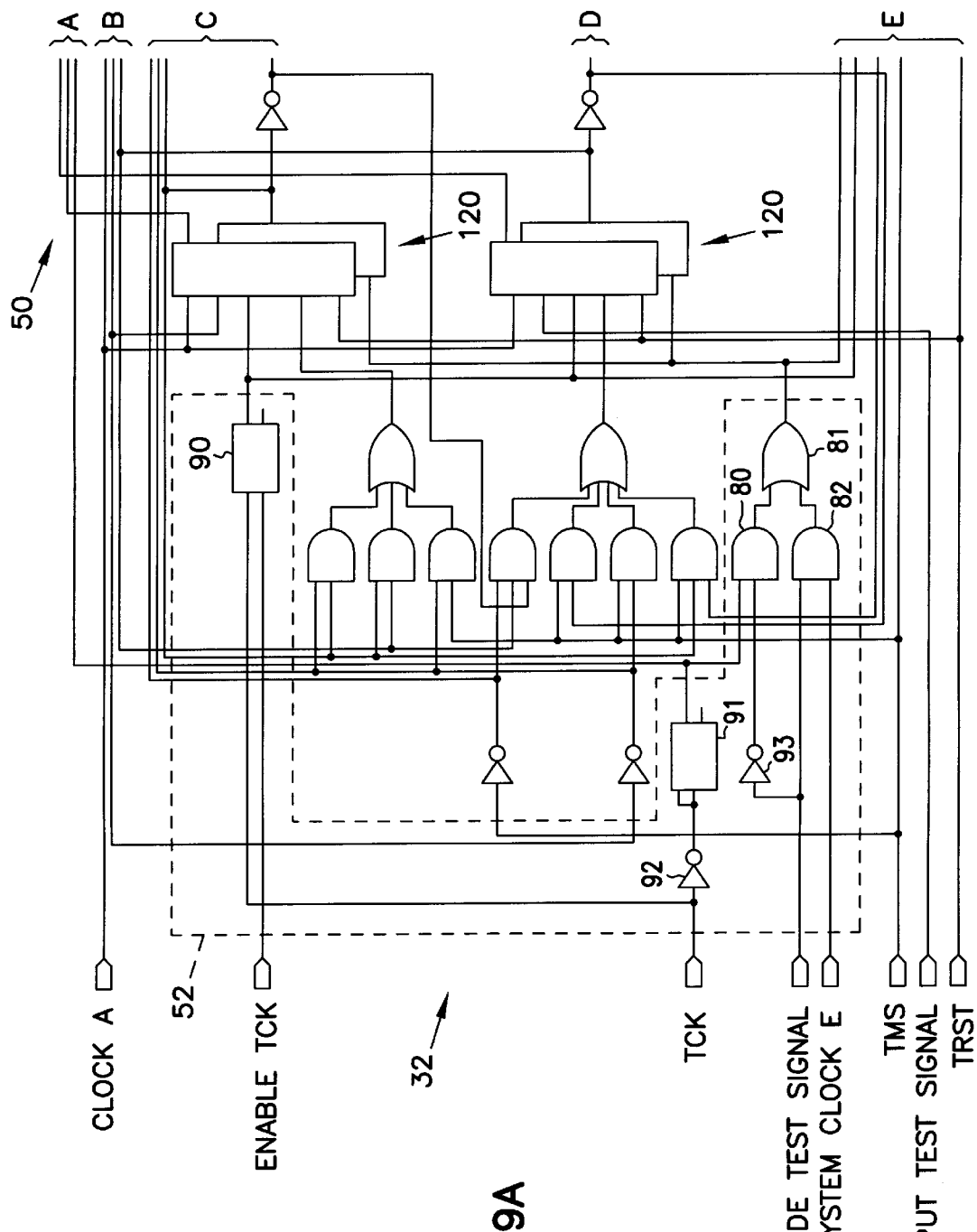
FIGS. 9A, 9B, and 9C (hereinafter collectively referred to as FIG. 9) is a logic diagram for the TAP controller of FIG. 2, including clock logic in accordance with the present invention.
Figure 9B:
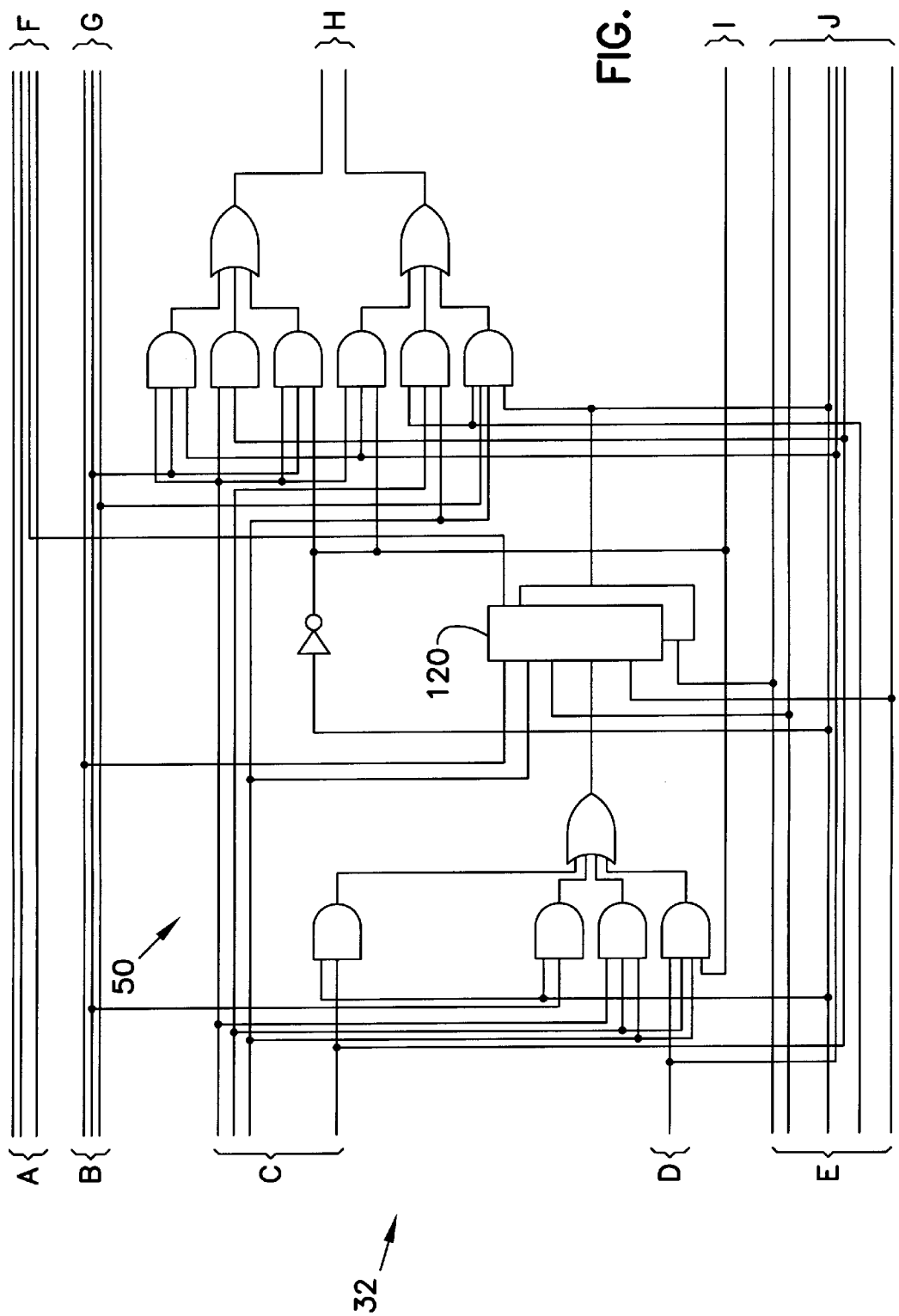
Figure 9C:
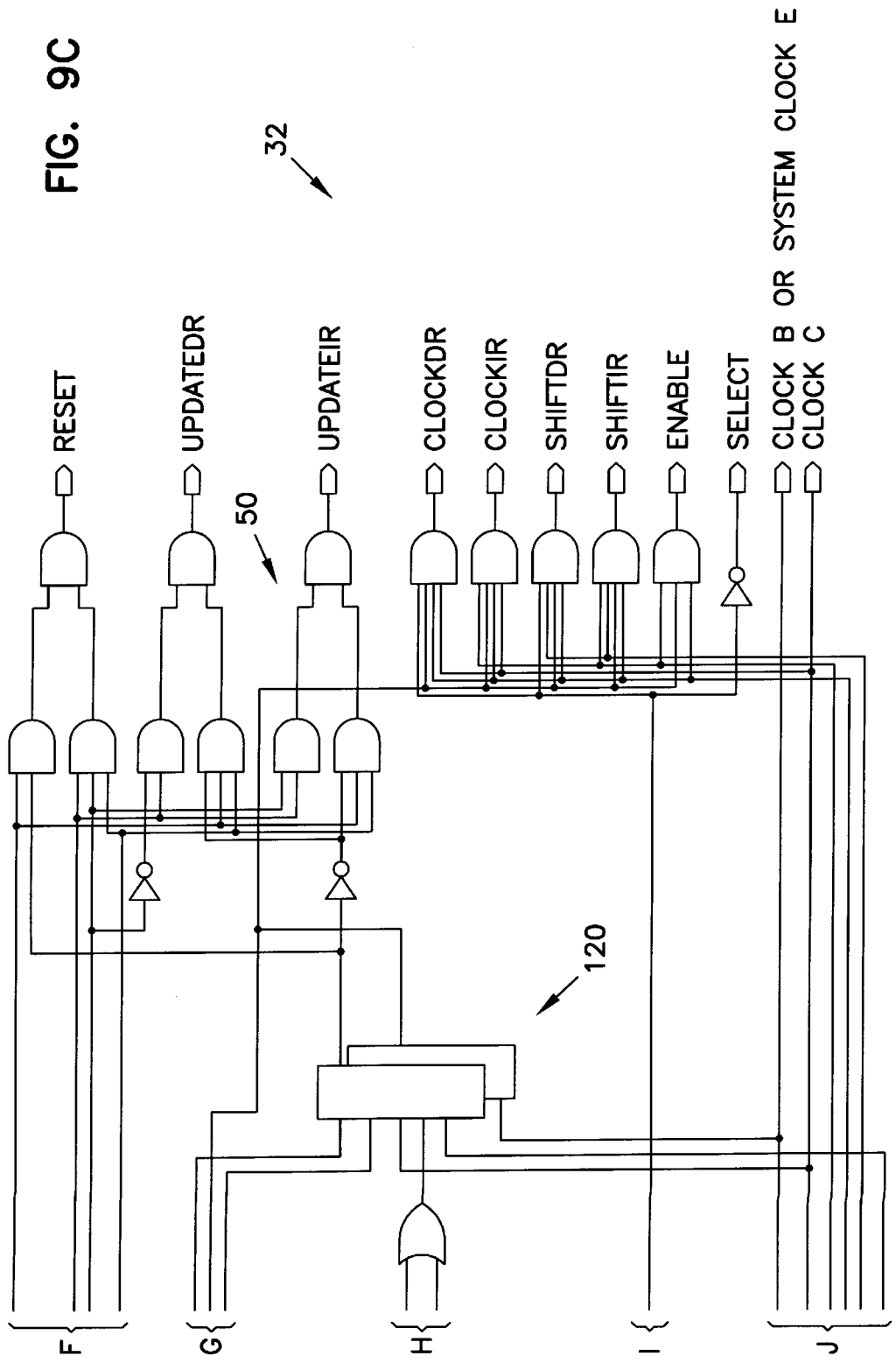

FIG. 9 is a logic diagram of TAP Controller 32 including TAP controller logic 50 and clock logic 52. The TAP controller 32 shall be described with respect to operation of the TAP controller 32 and associated test logic of test logic 30 such as the instruction register cell 42 of FIG. 6, the output boundary scan cell 44 of FIG. 7, and the input boundary scan cell 46 of FIG. 8, as operable in fabrication test mode and system test mode.

In system test mode, clock logic 52 has the following inputs thereto: Enable TCK, test clock TCK, mode test signal, and system clock E. In system mode, TCK is provided to a first clock chopper circuit 90 resulting in Clock C and to a second clock chopper circuit 91 after being inverted by inverter 92 resulting in Clock B. In addition, system clock E is provided to lower AND gate 82. The mode test signal goes to a logic 0 for system mode. With the mode test signal at logic 0, the upper AND gate 80 is enabled allowing TCK to provide control for TAP controller logic 50 as Clock B is output from OR gate 81 which lets the clock from either AND gate 80 or AND gate 82 through to the TAP controller logic 50. With the mode test signal at logic 0, the AND gate 82 is disabled which blocks the system clock E from getting through to TAP controller logic 50. At the same time as the mode test signal is at logic 0 representative of the TAP controller 32 being in system test mode, Enable TCK is also provided to clock chopper circuit 90 to allow generation of Clock C. In summary, in system mode, the TAP controller logic 50 is clocked under control of Clock C and Clock B.

The TAP controller logic 50, in system test mode, having combinational logic and dual latches 120 in accordance with the IEEE/ANSI 1149.1 standard, implements the TAP state transition diagram of FIG. 3. As such, in system mode, the TAP controller logic 50 generates as a function of Clock B and Clock C and other TAP controller inputs the following outputs: Reset, Clock IR, Clock DR, Shift IR, Shift DR, Update IR, Update DR, Select, and Enable. These outputs, in addition to Clock B and Clock C, are provided for operation and clocking of the associated test logic, such as the instruction register cell 42 of FIG. 6, the output boundary scan cell 44 of FIG. 7, and the input boundary scan cell 46 of FIG. 8. With respect to FIGS. 6-8, the logic therein shall be described only briefly as this test logic is designed in accordance with the IEEE/ANSI 1149.1-1990 standard and one skilled in the art will readily recognize the operation thereof.

Figure 6:
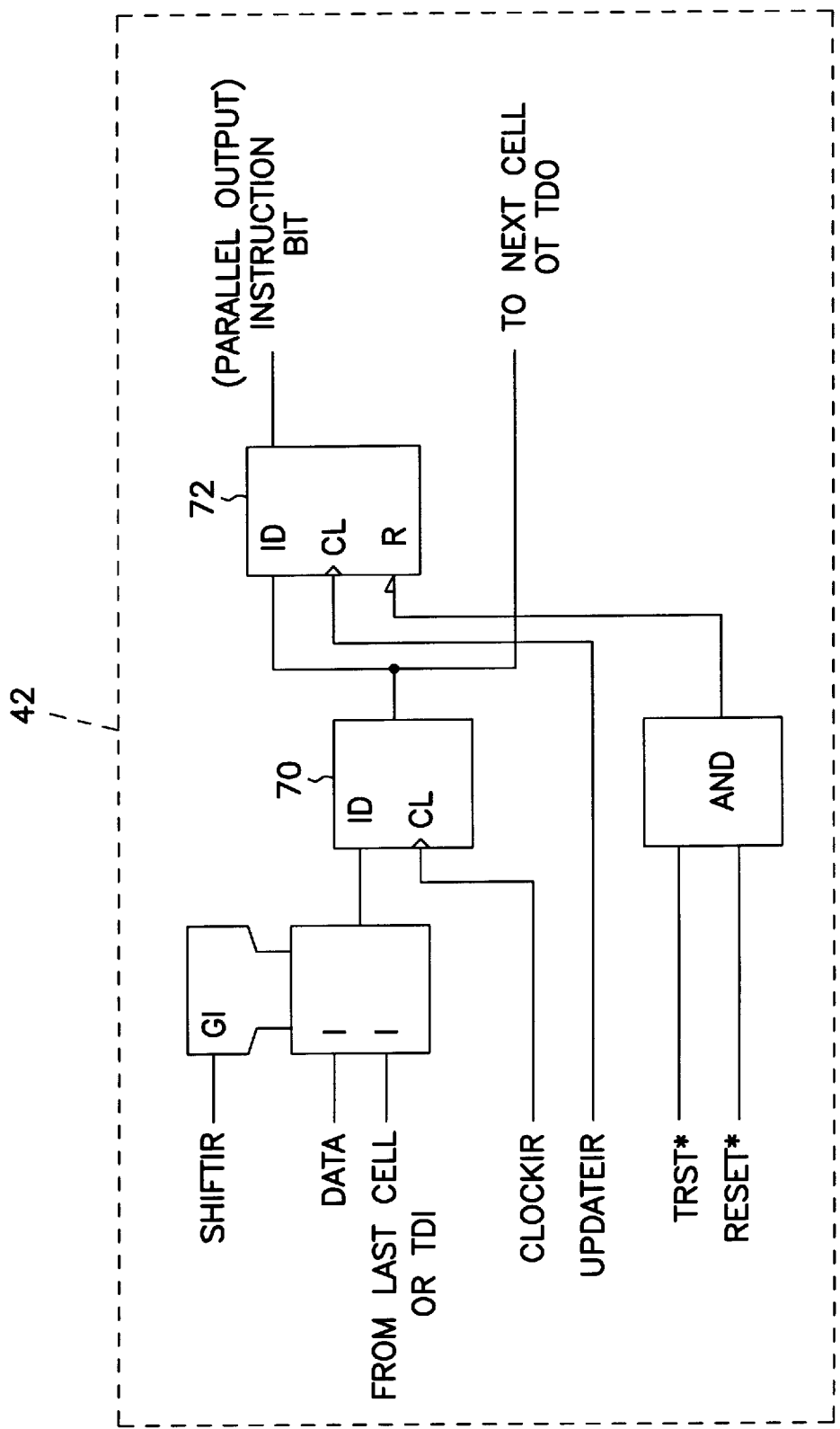
FIG. 6 is a block diagram of an instruction register cell of the instruction register of the associated test logic of FIG. 4.

FIG. 6 shows one instruction register cell 42 of a plurality of cells of instruction register 36. The instruction register cell is controlled in system mode by inputs: ShiftIR, Clock IR, Update IR, TRST, and Reset; which in part are generated by TAP controller logic 50 under control of Clock B and Clock C. In addition, the cell 42 includes TDI and data inputs for receiving input data and test data. Each instruction register cell 42 consists of a shift register latch 70 that holds instruction bits moving through the instruction register 36 of which the cell is a part and a parallel latch 72 that holds the current instruction.

Figure 7:
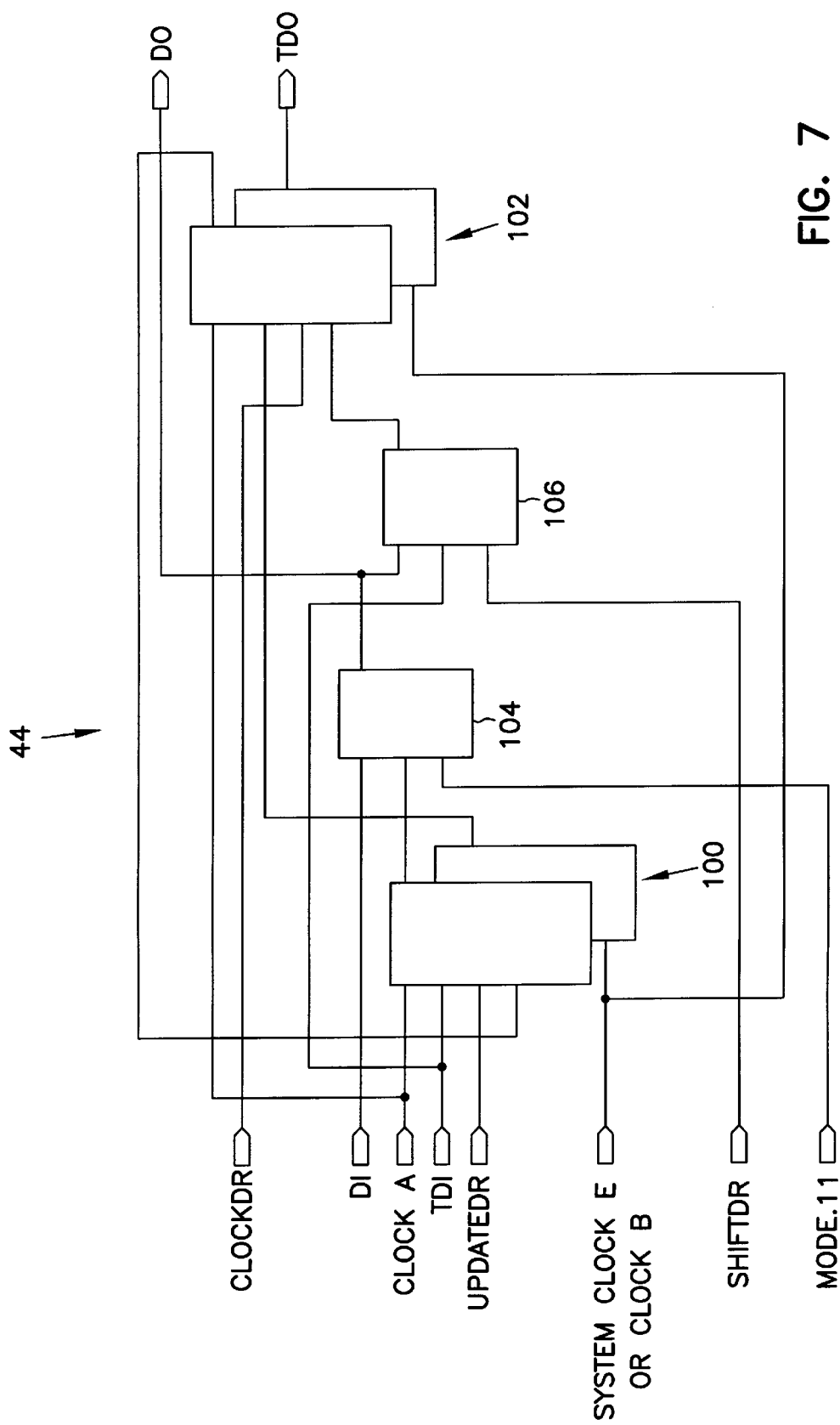
FIG. 7 is a block diagram of an output boundary scan cell of the boundary scan register of the associated test logic of FIG. 4.

The boundary scan register 34 of the test logic 30 as shown in FIG. 4 includes output boundary scan cells 44, FIG. 7, associated with each output pin 26 of ASIC 20 and input boundary scan cells 46, FIG. 8, associated with each input pin 24 of ASIC 20. The output boundary scan cells 44 include dual latches, 100 and 102 and multiplexers 104, 106. The output boundary scan cell 44 is operated in system mode under control of the inputs: Clock DR, Update DR, Clock B, Shift DR, and Mode.11 signal. Once the boundary scan cells are loaded with test data through input TDI, an exit test instruction is issued which controls the mode.11 signal input. The mode.11 signal is high when the exit test instruction is issued and is a select signal of a 2:1 multiplexer 104. When the mode.11 signal is logic 0, the system data is output. However, when the mode.11 signal is set to a logic 1, data from boundary scan cell 44 is output.

The input boundary scan cell 46, FIG. 8, includes a dual latch 110 and multiplexer 112. The input boundary scan cell 46 is an observe only cell, as set forth in IEEE/ANSI 1149.1 standard because the input boundary scan cell 46 can only capture the signal coming from the input pin. It does not have the ability to drive the data in the ASIC device logic. As shown in FIG. 8, the input boundary scan cell in system mode is clocked by signals Clock DR, Shift DR, and Clock B with data provided at input DI and test data at TDI. The Clock A is utilized only when in fabrication test mode as described further below.

In general, the test logic 30, operating in system test mode for boundary scan, functions typically under control of TCK which by clock choppers 90 and 91 is split into Clock B and Clock C. The TAP controller logic 50 is clocked by the B clock and C clock and generates the appropriate clocking signals, such as Update DR and Update IR for clocking of associated test logic such as the registers. Further, Clock B and Clock C, along with the other appropriate output of TAP controller logic 50 are provided to the other associated test logic of test logic 30 such as output and input boundary scan cells 40, 46 and instruction register 42. As such, in system mode, boundary scan operates in accordance with the IEEE/ANSI 1149.1 standard utilizing TCK.

In fabrication test mode, the mode test signal is a logic 1 and the clock logic 52 allows the TAP controller logic 50 to take its clock from system clock E. When the mode test signal is a logic 1, the upper AND gate 80 is turned off due to the mode test signal being run through an inverter gate 93. The lower AND gate 82 is enabled because the logic 1 mode test signal is provided straight thereto. The system clock E which is provided to AND gate 82 is provided at the output thereof and the OR gate 81 outputs the system clock E therefrom as it allows the clock from either AND gate 80 or AND gate 82 to its output. As should be readily apparent, the mode test signal controls both AND gates 80 and 82 such that only one of the two clocks, TCK (Clock B) or system clock E to be gated through the clock logic 52 at any one time.

Therefore, in fabrication test mode, with the clock A being provided from a tester performing test on the ASIC device logic and system clock E provided from clock logic 52, the test data at Input Test input is serially shifted into the dual latched TAP controller logic 50. Likewise, input test data is serially shifted through the instruction register cells 42, FIG. 6, as applied to the input TDI under control of clocking signals generated by IAP controller logic 50 under control of Clock A and system clock E, including: Shift IR, Clock IR, and Update IR. In addition, as can be readily seen by the inputs of FIG. 7 and FIG. 8 and the outputs of TAP controller logic 50, input test data provided at input TDI of the boundary scan cells 44, 46 is serially shifted therein under control of Clock A and system clock E. Clock A is provided by the tester and system clock E is provided from clock logic 52. The boundary scan cells 44, 46 are further clocked by various clock signal outputs by TAP controller logic 50, such as, ClockDR, UpdateDR, etc. As such, in fabrication test mode, input test data is serially shifted into TAP controller 32 and associated test logic of test logic 30 such as the instruction register cells and boundary scan cells 44, 46 under control, not of TCK, but Clock A and system clock E.

Once the test data is serially shifted into the TAP controller 32 and the associated logic of test logic 30, the mode test signal returns to logic 0 for system test mode and TCK is toggled once. Therefore, for one cycle, the TAP controller 32 and associate test logic of test logic 30 is controlled by Clock C and Clock B in accordance with IEEE/ANSI 1149.1 standard. After one pulse of TCK, the mode test signal is raised again to logic 1 and the resulting test data is serially shifted out under control of clock A and system clock E. Therefore, the test logic 30 can be entirely tested without the gated clock problems associated with the use of TCK for testing purposes at the same time that the device logic is tested after fabrication of the ASIC.

Although specific embodiments have been illustrated and described herein, it is appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the claims and the equivalents thereof.

What is claimed is:

1. An apparatus for level sensitive scan designs, comprising:

level sensitive scan design test logic including at least one serial scan test path; and a test access port controller operable in a system test mode under control of a test clock for controlling serial shifting of input test data into the at least one serial scan test path and for controlling serial shifting of resulting output test data out of the at least one serial scan test path after a system test under control of the test clock, the test access port controller further operable in a fabrication test mode and including clock logic for providing a system clock for controlling the serial shifting of input test data into the test access port controller and level sensitive scan design test logic and for controlling the serial shifting of resulting output test data out of the test access port controller and level sensitive scan design test logic under control of the system clock;

wherein the test access port controller and the level sensitive scan design logic are operated under test clock control for at least one test clock cycle, and wherein after said at least one test clock cycle resulting output data is serially shifted out of the test access port controller logic means and the level sensitive scan design logic under system clock control.

2. An apparatus according to claim 1, wherein the clock logic includes:

a system clock input for receiving the system clock;

a test clock input for receiving the test clock;

a mode test input for receiving a mode signal representative of whether the test access port controller is to operate in system test mode or fabrication test mode; and logic means for providing either the test clock or the system clock to the test access port controller for operation thereof as a function of the mode signal.

3. An apparatus according to claim 1, wherein the at least one serial scan test path includes a boundary scan serial test path.

4. A test apparatus for level sensitive scan designs, comprising:

level sensitive scan design test logic including at least one serial scan test path; and a test access port controller operable in a system test mode and a fabrication test mode, the test access port controller including:

clock logic means for providing one of a system clock and a test clock for control of the test access port controller as a function of the mode of operation of the test access port controller, test access port controller logic means for, in system test mode, controlling serial shifting of input test data into the at least one serial scan test path and for controlling serial shifting of resulting output test data out of the at least one serial scan test path after performance of system mode test under test clock control, and wherein, in fabrication test mode, input test data is serially shifted into the test access port controller logic means and level sensitive scan design test logic under system clock control, wherein the test access port controller and level sensitive scan design test logic are operated under test clock control for at least one cycle, and wherein after said at least one cycle resulting output data is serially shifted out of the test access port controller logic means and the level sensitive scan design logic under system clock control.

5. An apparatus according to claim 4, wherein the clock logic means includes:

a system clock input for receiving the system clock;

a test clock input for receiving the test clock;

a mode test input for receiving a mode signal representative of whether the test access port controller is to operate in system test mode or fabrication test mode; and means for providing either the test clock or the system clock to the test access port controller logic means for operation thereof as a function of the mode signal.

6. An apparatus according to claim 4, wherein the at least one serial scan test path includes a boundary scan serial test path.

7. A test apparatus for a level sensitive scan design, the level sensitive scan design including device logic, the device logic being tested after fabrication using a system clock and a test clock, the test apparatus comprising:

test design logic including at least one serial scan test path; and a test access port controller operable in system test mode under control of the test clock to serially shift input test data into the at least one serial scan test path and to serially shift resulting output test data out of the at least one serial scan test path, the test access port controller including clock logic means for switching clocking of the test access port controller from the test clock to the system clock to scan input test data into the test access port controller and the test design logic such that the test design logic and the test access port controller can be tested after fabrication when the device logic is tested.

8. An apparatus according to claim 7, wherein the tap access controller is operable in a system test mode and a fabrication test mode, wherein the clock logic means switches between the system clock and the test clock as a function of the mode of operation of the test access port controller, wherein the test access port controller further includes test access port controller logic means for, in system test mode, controlling serial shifting of input test data into the at least one serial scan test path and for controlling serial shifting of resulting output test data out of the at least one serial scan test path after performance of system test under test clock control, and wherein, in fabrication test mode, input test data is serially shifted into the test access port controller logic means and the test design logic under system clock control wherein the test access port controller and the test design logic are operated under test clock control for at least one cycle, and wherein after said at least one cycle resulting output data is serially shifted out of the test access port controller logic means and the level sensitive scan design logic under system clock control.

9. An apparatus according to claim 8, wherein the clock logic means includes:

a system clock input for receiving the system clock;

a test clock input for receiving the test clock;

a mode test input for receiving a mode signal representative of whether the test access port controller is to operate in system test mode or fabrication test mode; and means for providing either the test clock or the system clock to the test access port controller as a function of the mode signal.

10. An apparatus according to claim 8, wherein the at least one serial scan test path includes a boundary scan serial test path.

11. A test access port controller for use in a level sensitive scan design having test design logic including at least one serial scan test path, comprising:

test access port controller logic means operable in a system test mode for controlling the serial shifting of input test data into the at least one serial scan test path and for controlling serial shifting of resulting output test data out of the at least one serial scan test path after performance of system mode test under control of a test clock; and clock logic means for providing the test clock to the test access port controller logic means and test design logic in system test mode for providing a system clock to the test access port controller logic means and test design logic in a fabrication test mode to serially shift input test data into the test access port controller logic means and test design logic and to serially shift resulting output data out of the test access port controller logic means and test design logic, and to operate the test access port controller logic means and test design logic under test clock control for at least one cycle.

12. A test method for level sensitive scan designs, the level sensitive scan design having a test access port controller and test design logic including at least one serial scan test path, the test access port controller being clocked by a test clock for controlling testing using the at least one serial scan test path, the test method comprising the steps of:

serially shifting input test data into the test access port controller and the test design logic under control of a system clock;

operating the test access port controller under control of the test clock for at least one cycle to generate resulting output test data; and serially shifting resulting output test data out of the test access port controller and the test design logic under control of the system clock.

13. A method according to claim 12, wherein the method further includes the step of providing one of the system clock and the test clock to the test access port controller as a function of a mode signal.

14. A method according to claim 13, wherein the providing step includes the steps of:

receiving a system clock;

receiving a test clock;

receiving a mode signal representative of whether the test access port controller is to operate in a system test mode or a fabrication test mode; and providing either the test clock or the system clock to the test access port controller as a function of the mode signal.

* * * * *